United States Patent
Onishi

(10) Patent No.: US 9,627,957 B2
(45) Date of Patent: Apr. 18, 2017

(54) POWER CONVERSION DEVICE

(71) Applicant: Yukio Onishi, Nagoya (JP)

(72) Inventor: Yukio Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/783,312

(22) PCT Filed: May 22, 2013

(86) PCT No.: PCT/JP2013/064254
§ 371 (c)(1),
(2) Date: Oct. 8, 2015

(87) PCT Pub. No.: WO2014/188538
PCT Pub. Date: Nov. 27, 2014

(65) Prior Publication Data
US 2016/0072401 A1    Mar. 10, 2016

(51) Int. Cl.
*H02M 1/32* (2007.01)
*H02M 3/158* (2006.01)
(Continued)

(52) U.S. Cl.
CPC .............. *H02M 1/32* (2013.01); *H01L 23/24* (2013.01); *H01L 23/49562* (2013.01);
(Continued)

(58) Field of Classification Search
CPC ........ H02M 1/32; H02M 3/156; H02M 3/158; H02M 3/1588; H02M 7/003; H02M 7/537;
(Continued)

(56) References Cited

U.S. PATENT DOCUMENTS

2012/0013182 A1    1/2012  Minegishi et al.
2012/0153719 A1*   6/2012  Inaba .................... B60L 3/003
                                                    307/10.1
(Continued)

FOREIGN PATENT DOCUMENTS

| JP | 2008235502 A | 10/2008 |
| WO | 2010122648 | 5/2010 |
| WO | 2010122648 A1 | 10/2010 |

*Primary Examiner* — Fred E Finch, III
(74) *Attorney, Agent, or Firm* — Oliff PLC

(57) ABSTRACT

A power conversion device implementing an electrical-path-cutoff only if a power semiconductor element short-circuits, and to implement the cutoff at a timing earlier than when a battery fuse fuses, includes a pair of power semiconductor elements configured to be an upper arm element and a lower arm element, being connected in series between a positive-polarity electrode and a negative-polarity electrode; a short circuit detection circuit configured to detect a short circuit in the lower arm element; switching element for fusing, configured to be disposed between positive-polarity-side terminal of upper arm element on the positive-polarity electrode side, and negative-polarity-side terminal of lower arm element on the negative-polarity electrode side, and to be driven to have the positive-polarity-side terminal connected with the negative-polarity electrode when the short circuit is detected; and a cutoff part configured to be made of thin metallic wire for having the negative-polarity-side terminal connected with the negative-polarity electrode.

10 Claims, 7 Drawing Sheets

(51) Int. Cl.
  *H02M 7/00* (2006.01)
  *H02H 7/12* (2006.01)
  *H01L 23/24* (2006.01)
  *H01L 23/62* (2006.01)
  *H01L 23/495* (2006.01)
  *H03K 17/0814* (2006.01)
  *H03K 17/082* (2006.01)
  *H02H 3/02* (2006.01)
  *H02H 7/122* (2006.01)
  *H02M 7/537* (2006.01)
  *H01L 23/00* (2006.01)

(52) U.S. Cl.
  CPC ........ *H01L 23/49575* (2013.01); *H01L 23/62* (2013.01); *H02H 3/025* (2013.01); *H02H 7/1213* (2013.01); *H02H 7/1225* (2013.01); *H02M 3/1588* (2013.01); *H02M 7/003* (2013.01); *H03K 17/0828* (2013.01); *H03K 17/08148* (2013.01); *H01L 24/45* (2013.01); *H01L 24/48* (2013.01); *H01L 2224/16245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/49175* (2013.01); *H01L 2224/73253* (2013.01); *H01L 2924/1305* (2013.01); *H01L 2924/13055* (2013.01); *H01L 2924/13091* (2013.01); *H01L 2924/181* (2013.01); *H02M 3/158* (2013.01); *H02M 7/537* (2013.01)

(58) Field of Classification Search
  CPC ... H02H 7/1213; H02H 7/1225; H02H 7/1227
  See application file for complete search history.

(56) References Cited

U.S. PATENT DOCUMENTS

| | | | |
|---|---|---|---|
| 2013/0062724 A1* | 3/2013 | Tokuyama | H05K 7/1432 257/499 |
| 2014/0055897 A1* | 2/2014 | Tsunekawa | H02H 3/20 361/86 |
| 2014/0177298 A1* | 6/2014 | Reymond | H02M 1/32 363/56.03 |
| 2014/0240872 A1* | 8/2014 | Nomura | H02M 3/156 361/18 |
| 2015/0295489 A1* | 10/2015 | Imai | H01L 23/5256 361/91.7 |
| 2016/0105112 A1* | 4/2016 | Ukegawa | H02H 7/1213 323/271 |
| 2016/0226396 A1* | 8/2016 | Hattori | H02M 7/53871 |
| 2016/0261180 A1* | 9/2016 | Brueckner | H02M 1/32 |

* cited by examiner

POWER CONVERSION DEVICE

TECHNICAL FIELD

The present invention relates to a power conversion device, and especially relates to a power conversion device that is suitable for cutting off an electrical path promptly when a lower arm element constituting a pair of power semiconductor elements, short-circuits.

BACKGROUND ART

Conventionally, a power conversion device has been known that cuts off an electrical path when a power semiconductor element short-circuits (see, for example, Patent Document 1). In this power conversion device, the power semiconductor element is connected with a positive-polarity terminal via a thin metallic wire, and is connected with a negative-polarity terminal via a thin metallic wire.

In this structure, if the power semiconductor element short-circuits, an overcurrent, which is several to several dozen times greater than the rated current, flows to fuse the thin metallic wire by self-heating. Therefore, it is possible to promptly cut off the electrical path when the power semiconductor element short-circuits, and to prevent the overcurrent from circulating.

RELATED-ART DOCUMENTS

Patent Documents

[Patent Document 1] Japanese Laid-open Patent Publication No. 2008-235502

SUMMARY OF THE INVENTION

Problem to be Solved by Invention

Incidentally, for example, if a power conversion device described above is built in a vehicle, when the power semiconductor element short-circuits, and a battery fuse provided on the upstream side fuses, then, traveling cannot be continued by the battery. Thereupon, to avoid an occurrence of such a situation, the thin metallic wire needs to be fused at a timing earlier than when the battery fuse fuses if the power semiconductor element short-circuits. However, even if the fusing characteristic of the thin metallic wire is specified in accordance with such a requirement, it is difficult to prevent the thin metallic wire from fusing if a ripple or transient current is generated in a normal use range of the fusing characteristic.

In view of the above, the present invention has an object to provide a power conversion device that can make an electrical-path-cutoff take place only if a power semiconductor element short-circuits, at a timing earlier than when a battery fuse fuses.

Means to Solve the Problem

The above object is achieved by a power conversion device that includes a pair of power semiconductor elements configured to be an upper arm element and a lower arm element, being connected in series between a positive-polarity electrode and a negative-polarity electrode; a short circuit detection circuit configured to detect a short circuit in the lower arm element; a switching element for fusing, configured to be disposed between a positive-polarity-side terminal of the upper arm element on the positive-polarity electrode side, and a negative-polarity-side terminal of the lower arm element on the negative-polarity electrode side, and to be driven to have the positive-polarity-side terminal connected with the negative-polarity electrode when the short circuit is detected; and a cutoff part configured to be made of a thin metallic wire for having the negative-polarity-side terminal connected with the negative-polarity electrode.

Advantage of the Invention

According to the present invention, it is possible to make the electrical-path-cutoff take place only if the power semiconductor element short-circuits, at a timing earlier than when the battery fuse fuses.

MODE FOR CARRYING OUT THE INVENTION

In the following, specific embodiments of a power conversion device will be described according to the present invention with reference to the drawings.

Figure 1:
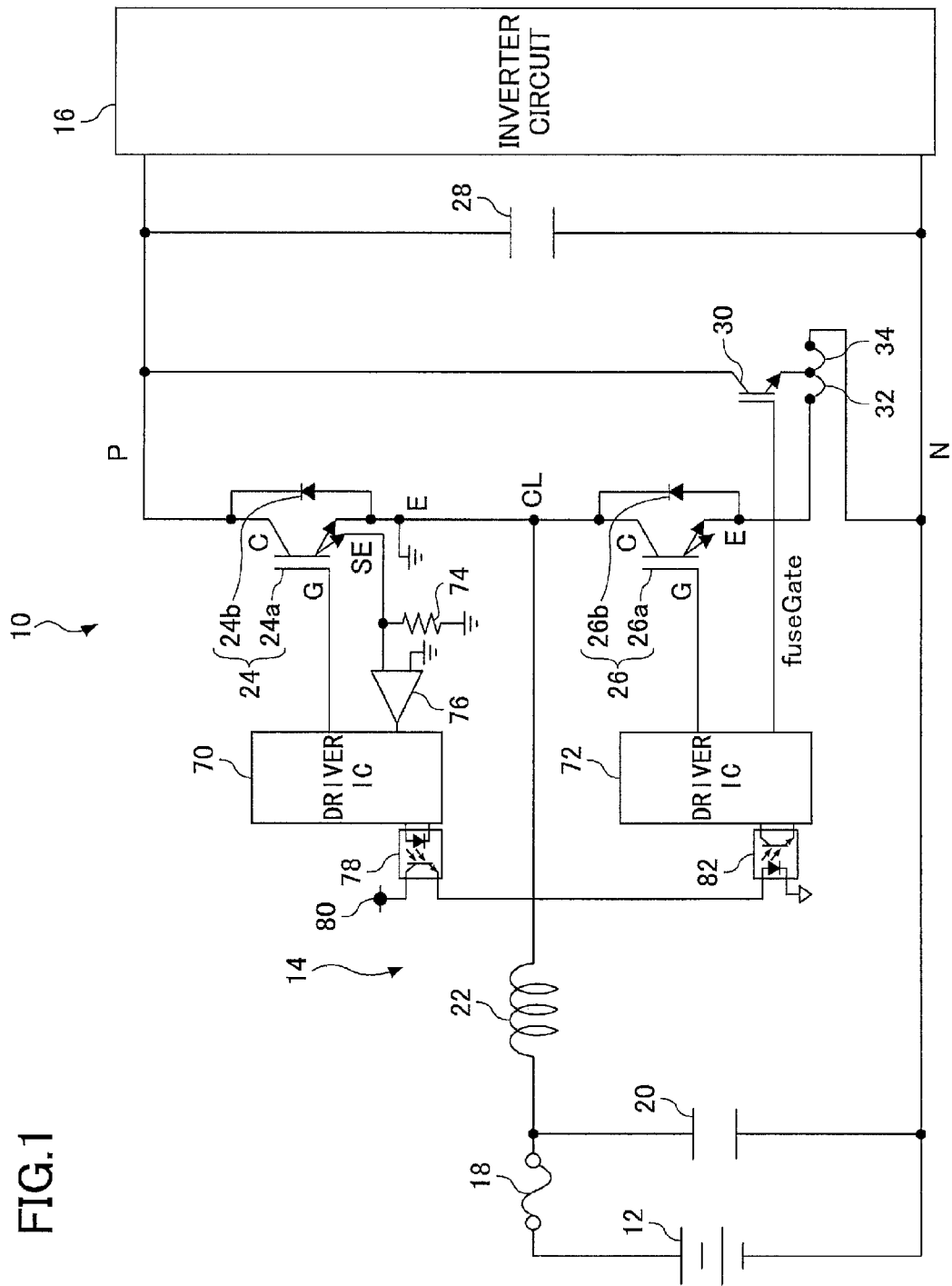
FIG. 1 is a circuit configuration diagram of a power conversion device according to an embodiment of the present invention.
Figure 2:
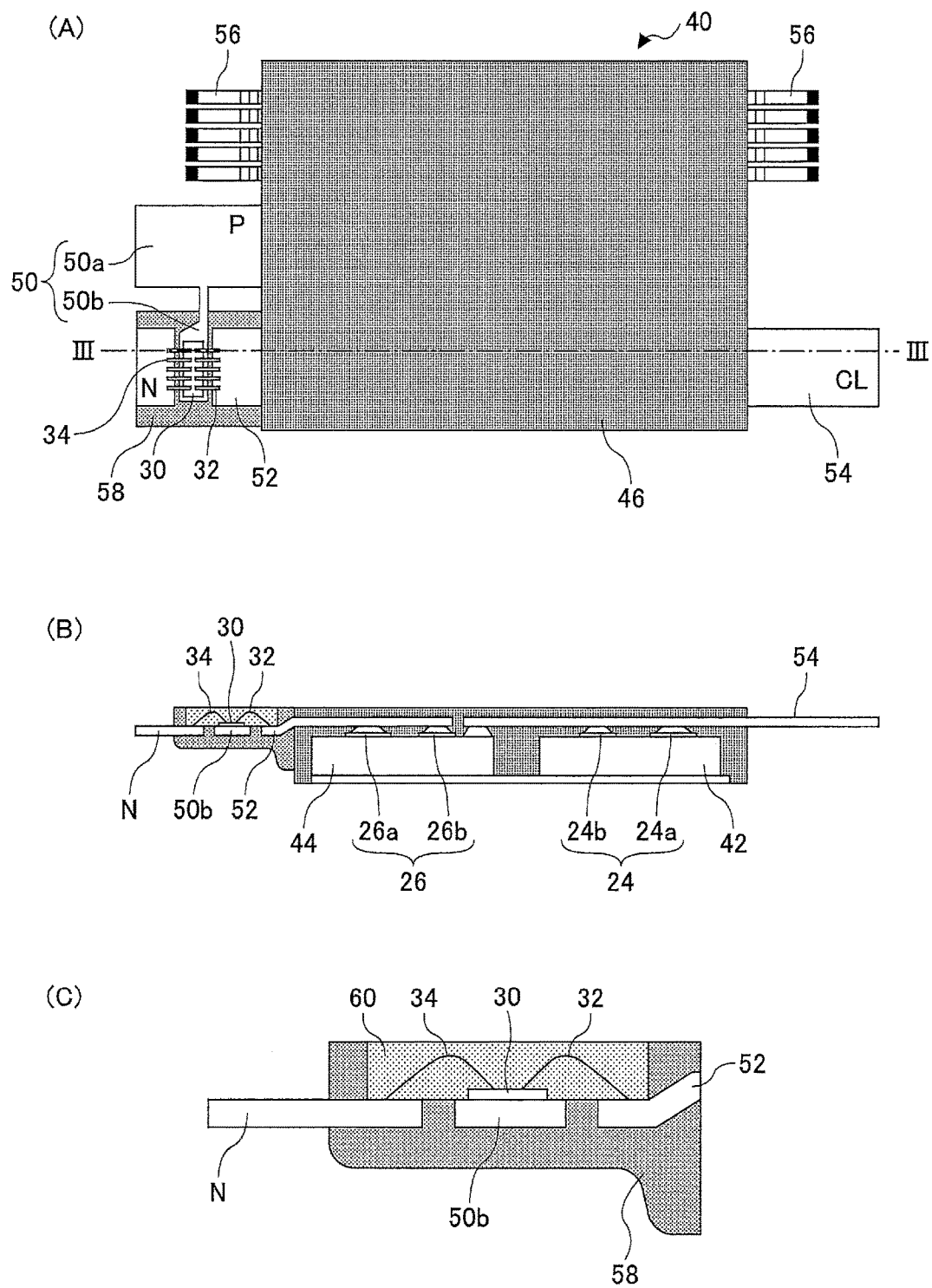
FIG. 2 includes structural diagrams of a power module included in a power conversion device in the present embodiment.

FIG. 1 illustrates a circuit configuration diagram of a power conversion device 10 according to an embodiment of the present invention. Also, FIG. 2 illustrates structural diagrams of a power module included in the power conversion device 10 in the present embodiment. Note that FIG. 2(A) illustrates a top view of the power module; FIG. 2(B) illustrates a cross-sectional view of the power module illustrated in FIG. 2(A) taken along the line III-III; and FIG. 2(C) illustrates an enlarged cross-sectional view of a core part of the power module illustrated in FIG. 2(B).

The power conversion device 10 in the present embodiment is built in, for example, an electric vehicle or a hybrid vehicle, and is a device to convert power of an in-vehicle battery, and to supply the power to a motor for driving and the like. As illustrated in FIG. 1, the power conversion device 10 includes an in-vehicle battery 12, a booster circuit 14, and an inverter circuit 16.

The in-vehicle battery 12 is a lithium-ion battery or a nickel-hydrogen battery that can be charged and discharged, and is a high-voltage battery that can output a direct current voltage, for example, of 240 V. The output of the in-vehicle battery 12 is connected with a battery fuse 18. The battery fuse 18 is a fuse having the fusing characteristic that does not fuse in a normal use range of the power conversion device 10, but fuses by self-heating if a current greater than or equal to a rated current flows.

The booster circuit 14 is connected with the in-vehicle battery 12 via the battery fuse 18, and is a circuit to boost an input voltage supplied from the in-vehicle battery 12, to a predetermined direct current voltage (for example, 650 V). Also, the inverter circuit 16 is connected with the booster circuit 14, and is a circuit to convert a direct current voltage supplied from the booster circuit 14 into an alternating current voltage. The inverter circuit 16 is connected with a load such as a motor for driving. This load operates on alternating current power supplied from the inverter circuit 16.

Note that the load including the motor for driving described above may also function as a power generator. When the load functions as a power generator, the inverter circuit 16 converts an alternating current voltage supplied from the load side into a direct current voltage to supply it to the booster circuit 14. The booster circuit 14 steps down the direct current voltage supplied from the inverter circuit 16 to a predetermined direct current voltage (a voltage that matches the voltage of the in-vehicle battery 12). In this case, the in-vehicle battery 12 can store the power generated by the load.

The booster circuit 14 includes a filter capacitor 20, a reactor 22, a pair of power semiconductor elements 24 and 26, and a smoothing capacitor 28. The filter capacitor 20 is connected in parallel with the in-vehicle battery 12, and is a capacitor to stabilize the input voltage supplied from the in-vehicle battery 12 to the booster circuit 14. The reactor 22 is configured to have one terminal connected with the positive-polarity terminal of the in-vehicle battery 12, and to have another terminal connected with a common connection point CL between the pair of power semiconductor elements 24 and 26. When converting the voltage between the in-vehicle battery 12 side and the inverter circuit 16 side, the reactor 22 operates to discharge or store the power.

The pair of power semiconductor elements 24 and 26 are an upper arm element and a lower arm element that are connected in series between a positive-polarity electrode P and a negative-polarity electrode N. The power semiconductor element 24, or the upper arm element connected with the positive-polarity electrode P, includes an insulation-gate-type bipolar transistor (IBGT) 24a, which is a switching element to execute switching operations, and a diode 24b that is connected in parallel between the collector and emitter of the IGBT 24a. The diode 24b allows a current to flow from the emitter E to the collector C of the IGBT 24a.

Also, the power semiconductor element 26, or the lower arm element connected with the negative-polarity electrode N, includes an insulation-gate-type bipolar transistor (IBGT) 26a, which is a switching element to execute switching operations, and a diode 26b that is connected in parallel between the collector and emitter of the IGBT 26a. The diode 26b allows a current to flow from the emitter E to the collector C of the IGBT 26a. The other terminal of the reactor 22 described above is connected with the emitter of the IGBT 24a and the collector of the IGBT 26a.

The smoothing capacitor 28 is connected between the positive-polarity electrode P and the negative-polarity electrode N, and is a capacitor to smooth the voltage between the positive-polarity electrode P and the negative-polarity electrode N, namely, the output of the booster circuit 14. The positive-polarity electrode P and the negative-polarity electrode N are connected with the inverter circuit 16. The inverter circuit 16 converts the direct current voltage between the positive-polarity electrode P and the negative-polarity electrode N into the alternating current voltage, and supplies it to the load including the motor for driving.

Also, the power conversion device 10 includes a switching element 30 that is disposed between the positive-polarity-side terminal of the upper arm element 24 on the positive-polarity electrode P side (namely, the collector C of the IGBT 24a), and the negative-polarity-side terminal of the lower arm element 26 on the negative-polarity electrode N side (namely, the emitter E of the IGBT 26a). The switching element 30 is an element for fusing, to cut off the electrical path, which is driven to be on when the lower arm element 26 short-circuits. In the following, the switching element 30 will be referred to as the "switching element for fusing 30".

The switching element for fusing 30 is an insulation-gate-type bipolar transistor (IBGT) having a high voltage tolerance and a low capacitance, which can tolerate a voltage generated between the positive-polarity electrode P and the negative-polarity electrode N (for example, 650 V). The switching element for fusing 30 is configured to have its collector C connected with the positive-polarity-side terminal of the upper arm element 24 (namely, the collector C of the IGBT 24a, and the positive-polarity electrode P), and to have its emitter E connected with the negative-polarity-side terminal of the lower arm element 26 (namely, the emitter E of the IGBT 26a).

In addition to be connected with the negative-polarity-side terminal of the lower arm element 26, the emitter E of the switching element for fusing 30 is connected with the negative-polarity electrode N. The emitter E of the switching element for fusing 30, and the negative-polarity-side terminal of the lower arm element 26 are connected with each other by a bonding wire 32, which is a thin metallic wire. Also, the emitter E of the switching element for fusing 30, and the negative-polarity electrode N are connected with each other by a bonding wire 34, which is a thin metallic wire. The bonding wires 32 and 34 are made of, for example, aluminum, copper, or gold.

The upper arm element 24 and the lower arm element 26 of the booster circuit 14, and the switching element for fusing 30 are respective semiconductor elements that are built in the power module 40 by resin molding as illustrated in FIG. 2, and are thin, rectangular-shaped semiconductor chips. The power module 40 is a module that is formed by resin sealing in a state where the IGBT 24a and the diode 24b of the upper arm element 24 are placed on a lead frame 42 made of a metal plate, and the IGBT 26a and the diode 26b of the upper arm element 26 are placed on a lead frame 44 made of a metal plate. The power module 40 includes a resin part 46 made of resin such as an epoxy resin, and is formed to have a nearly rectangular shape.

The power module 40 has a part of the positive-polarity electrode P, which is connected with the positive-polarity-side terminal of the upper arm element 24, (referred to as the "positive-polarity protruding part 50" below) protruding externally; a part of the negative-polarity-side terminal of the lower arm element 26 (referred to as the "negative-polarity protruding part 52" below) protruding externally; and a part of a connection electrode, which is the common connection point CL between the upper arm element 24 and the lower arm element 26, (referred to as the "connection protruding part 54" below) protruding externally. Also, the power module 40 has a part of a control electrode to drive and control the IGBT 24a of the upper arm element 24 and the IGBT 26*a* of the lower arm element 26 and to detect a current (referred to as the "control protruding part 56" below) protruding externally.

In the power module 40, the positive-polarity protruding part 50 and the negative-polarity protruding part 52 are closely disposed to be adjacent to each other. The positive-polarity protruding part 50 includes a main body part 50*a* and a protruding part 50*b* that further protrudes out of the main body part 50*a*. The protruding part 50*b* is disposed to be adjacent to the tip of the negative-polarity protruding part 52, on the external side of the tip of the negative-polarity protruding part 52. The switching element for fusing 30 is placed on the protruding part 50*b*. The switching element for fusing 30 is fixed on the protruding part 50*b* by solder or the like so that the collector contacts the surface of the protruding part 50*b* and the emitter is exposed on the surface. The negative-polarity protruding part 52 and the emitter of the switching element for fusing 30 are connected with each other by a bonding wire(s) 32.

The negative-polarity electrode N is disposed to be adjacent to the protruding part 50*b* of the positive-polarity protruding part 50, on the external side of the protruding part 50*b*. The negative-polarity electrode N and the emitter of the switching element for fusing 30 are connected with each other by a bonding wire(s) 34. The negative-polarity protruding part 52, the protruding part 50*b* of the positive-polarity protruding part 50, and the negative-polarity electrode N are molded in a housing 58 made of resin such as an epoxy resin. The switching element for fusing 30 and the bonding wires 32 and 34 are protected by a gelatinous member 60 that is inserted into the housing 58.

The power conversion device 10 includes a driver IC for the upper arm 70 to drive and control the IGBT 24*a* of the upper arm element 24, and a driver IC for the lower arm 72 to drive and control the IGBT 26*a* of the lower arm element 26 by PWM. The driver IC for the upper arm 70 outputs a gating signal to the gate of the IGBT 24*a* to drive the IGBT 24*a* by PWM control. Also, the driver IC for the lower arm 72 outputs a gating signal to the gate of the IGBT 26*a* to drive the IGBT 26*a* by PWM control.

In the power conversion device 10 described above, if a voltage from the in-vehicle battery 12 is input into the reactor 22, a current flows through the positive-polarity terminal of the in-vehicle battery 12; the reactor 22; the diode 24*b* of the upper arm element 24; the positive-polarity electrode P; the load side; the negative-polarity electrode N; and the negative-polarity terminal of the in-vehicle battery 12, in this order, with which the reactor 22 is charged.

In such a state, if the IGBT 26*a* of the lower arm element 26 is driven to be on by the gating signal from the driver IC for the lower arm 72, a current flows through the positive-polarity terminal of the in-vehicle battery 12; the reactor 22; the IGBT 26*a* of the lower arm element 26; the bonding wire 32; the emitter of the switching element for fusing 30; the bonding wire 34; the negative-polarity electrode N; and the negative-polarity terminal of the in-vehicle battery 12, in this order, with which the amount of the current linearly increases while the time passes, and the reactor 22 is charged further with the increasing current. In this case, the smoothing capacitor 28 is discharged, to maintain power supply to the load side.

Next, if the IGBT 26*a* of the lower arm element 26 is driven to be off, a current flows through the positive-polarity terminal of the in-vehicle battery 12; the reactor 22; the diode 24*b* of the upper arm element 24; the positive-polarity electrode P; the load side; the negative-polarity electrode N; and the negative-polarity terminal of the in-vehicle battery 12, in this order, with which the amount of the current linearly decreases while the time passes, and the reactor 22 is discharged further with the decreasing current.

When this process is executed, the output voltage of the booster circuit 14 becomes higher than the output voltage of the in-vehicle battery 12, the smoothing capacitor 28 is charged to this voltage, and power supply to the load side is maintained. After that, the IGBT 26*a* of the lower arm element 26 repeats to turn on and off, which makes the booster circuit 14 continuously output the voltage that is higher than the output voltage of the in-vehicle battery 12, to the load side.

Also, if the inverter circuit 16 converts an alternating current voltage supplied from the load side as the power generator into a direct current voltage, when the IGBT 24*a* of the upper arm element 24 is driven to be on by a gating signal from the driver IC for the upper arm 70, the voltage is applied to the reactor 22, the filter capacitor 20, and the in-vehicle battery 12, which causes the reactor 22 to be charged by a voltage difference between the direct current voltage by the inverter circuit 16 and the voltage of the filter capacitor 20. In this case, a current flows through the inverter circuit 16 side; the positive-polarity electrode P; the IGBT 24*a* of the upper arm element 24; the reactor 22; and the filter capacitor 20 and the in-vehicle battery 12, in this order, and the amount of the current linearly increases while the time passes.

Next, if the IGBT 24*a* of the upper arm element 24 is driven to be off, the reactor 22 is discharged by the voltage of the filter capacitor 20 connected in parallel. In this case, a current flows through the reactor 22; the filter capacitor and the in-vehicle battery 12; the negative-polarity electrode N; the bonding wire 34; the emitter of the switching element for fusing 30; the bonding wire 32; and the diode 26*b* of the lower arm element 26, in this order, and the amount of the current linearly decreases while the time passes.

When this process is executed, the output voltage of the booster circuit 14 becomes lower than the direct current voltage by the inverter circuit 16, and the filter capacitor 20 and the in-vehicle battery 12 are charged to this voltage. After that, the IGBT 24*a* of the upper arm element 24 repeats to turn on and off, which makes the booster circuit 14 continuously output the voltage that is lower than the direct current voltage by the inverter circuit 16, to the in-vehicle battery 12 side.

Figure 3:
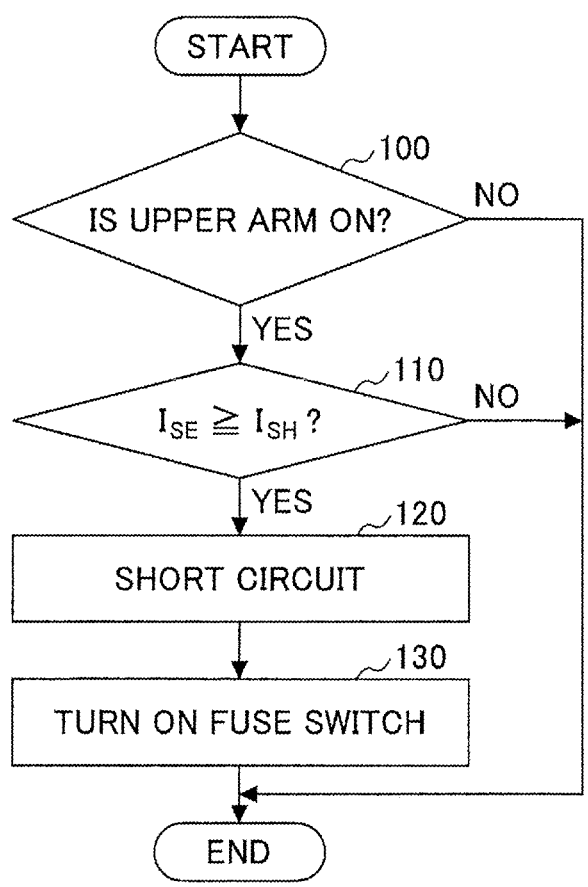
FIG. 3 is a diagram that illustrates a flowchart of an example of a control routine executed in a power conversion device in the present embodiment.

FIG. 3 is a diagram that illustrates a flowchart of an example of a control routine executed in the power conversion device 10 in the present embodiment.

In the power conversion device 10 in the present embodiment, the IGBT 24*a* of the upper arm element 24 includes a sense emitter SE to split a collector current. This sense emitter SE has a function to split off a very small current from the collector current (for example, a current that is one several thousandth of the total emitter current). The sense emitter SE is connected with a current sense resistor 74. The current sense resistor 74 has a resistance value Rs, and has a function to convert a sense current flowing in the sense emitter SE into a sense voltage Vs, namely, a function to extract it as the emitter voltage.

The sense voltage Vs converted from the sense current by the current sense resistor 74 is supplied to a comparator 76. The comparator 76 is a comparator that determines, based on the sense voltage Vs, whether a current greater than or equal to a predetermined value (namely, an overcurrent) flows in the electrical path between the positive-polarity electrode P and the negative-polarity electrode N, and detects whether a short circuit exists between the positive-polarity electrode P and the negative-polarity electrode N (specifically, a short circuit generated in the IGBT 26a of the lower arm element 26 when the IGBT 24a of the upper arm element 24 is driven to be on).

The output signal of the comparator 76 is supplied to the driver IC for the upper arm 70. In a circumstance when outputting a gating signal to the IGBT 24a of the upper arm element 24 to have the IGBT 24a driven to be on (positive determination at Step 100), the driver IC for the upper arm 70 determines, based on the signal from the comparator 76, whether a current $I_{SE}$ flowing in the electrical path between the positive-polarity electrode P and the negative-polarity electrode N is greater than or equal to a predetermined threshold $I_{SH}$ (Step 110). Note that the predetermined threshold $I_{SH}$ is a minimum current value with which it is determined that an overcurrent flows in the electrical path due to a short circuit generated between the positive-polarity electrode P and the negative-polarity electrode N.

If determining that the current $I_{SE}$ flowing in the electrical path between the positive-polarity electrode P and the negative-polarity electrode N is greater than or equal to the predetermined threshold $I_{SH}$, the driver IC for the upper arm 70 determines that the positive-polarity electrode P and the negative-polarity electrode N short-circuit, to generate a short circuit in the IGBT 26a of the lower arm element 26 when the IGBT 24a of the upper arm element 24 is driven to be on (Step 120), and generates a drive signal to have the switching element for fusing 30 driven to be on (Step 130).

The output side of the driver IC for the upper arm 70 is connected with the input side of the photocoupler 78. The driver IC for the upper arm 70 outputs the drive signal generated as described above to the photocoupler 78. The output side of the photocoupler 78 is connected with a floating power source 80, and is connected with the input side of a photocoupler 82. The photocoupler 78 is an element to transfer the drive signal of the driver IC for the upper arm 70 to the photocoupler 82 while electrically insulating the signal by using light. The output side of the photocoupler 82 is connected with the input side of the driver IC for the lower arm 72. The photocoupler 82 is an element to transfer the transfer signal from the photocoupler 78 to the driver IC for the lower arm 72 while electrically insulating the signal by using light.

The driver IC for the lower arm 72 is connected with the gate of the switching element for fusing 30 described above. Based on the drive signal of the driver IC for the upper arm 70 via the photocouplers 78 and 82, the driver IC for the lower arm 72 detects a short circuit between the positive-polarity electrode P and the negative-polarity electrode N, and generates a gating signal to be supplied to the gate of the switching element for fusing 30. Specifically, if the positive-polarity electrode P and the negative-polarity electrode N short-circuit, and the driver IC for the upper arm outputs a drive signal to have the switching element for fusing 30 driven to be on, the driver IC for the lower arm 72 generates a gating signal to have the switching element for fusing 30 driven to be on.

Figure 4:
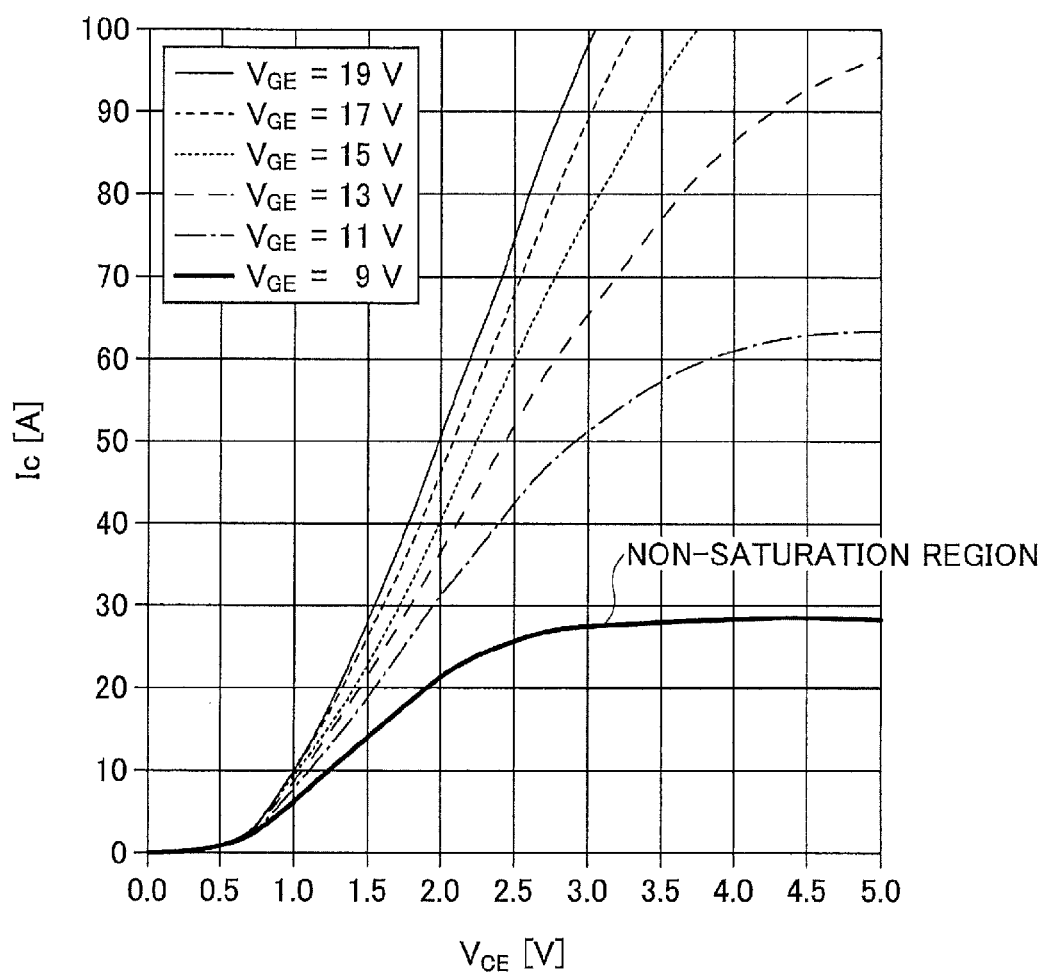
FIG. 4 is a diagram that illustrates a characteristic of a switching element for fusing included in a power conversion device in the present embodiment.
Figure 5:
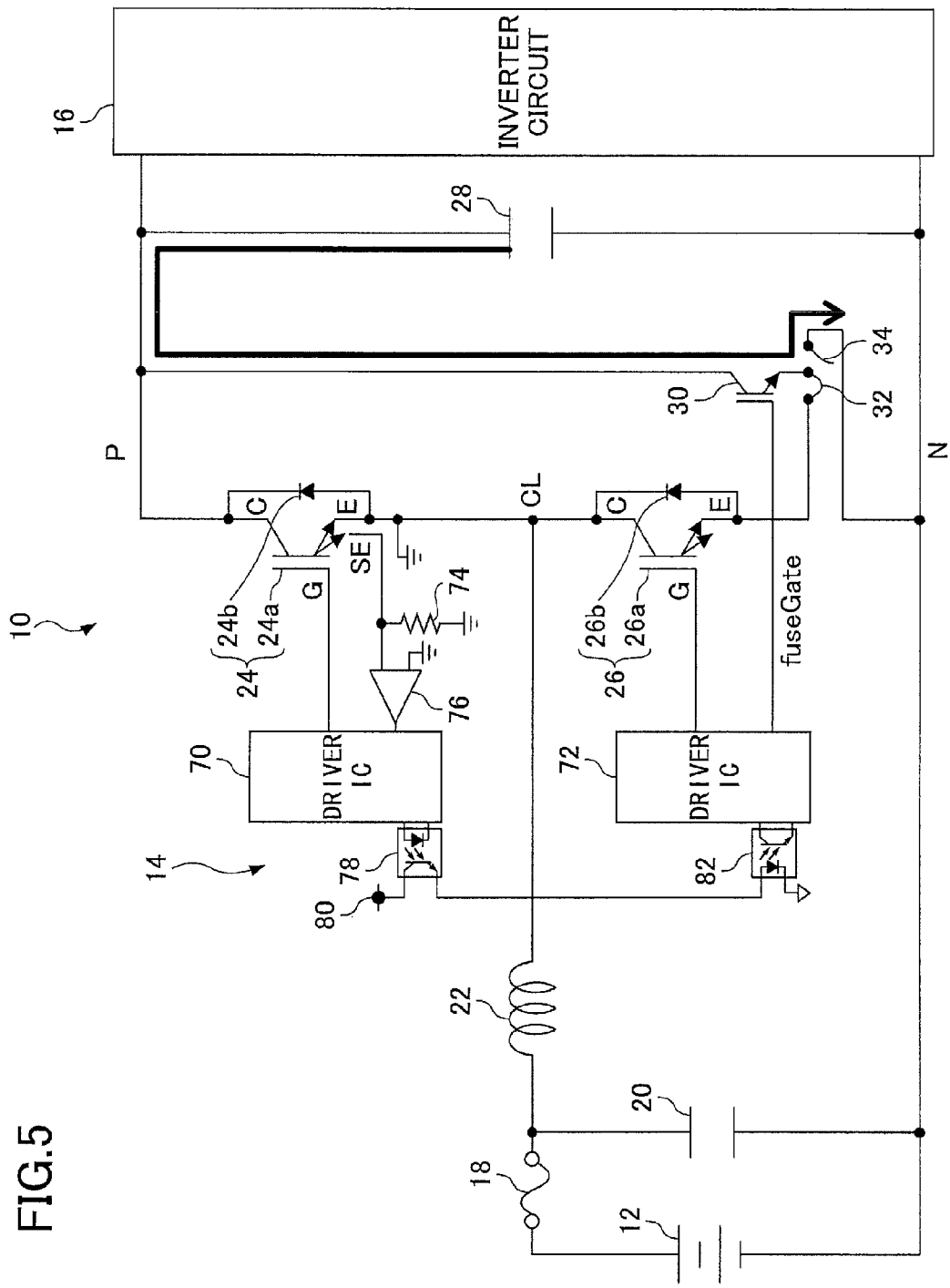
FIG. 5 is a circuit configuration diagram illustrating that an electrical path is cut off by driving a switching element for fusing to be on in a power conversion device in the present embodiment.

FIG. 4 illustrates a diagram that represents a characteristic of the switching element for fusing 30 included in the power conversion device 10 in the present embodiment. FIG. 5 is a circuit configuration diagram illustrating that an electrical path is cut off by driving the switching element for fusing 30 to be on in the power conversion device 10 in the present embodiment. FIG. illustrates cross-sectional views of a core part of the power conversion device 10, before and after an electrical path is cut off in the present embodiment.

In the present embodiment, after having generated a gating signal to have the switching element for fusing 30 driven to be on, the driver IC for the lower arm 72 outputs the gating signal to the gate of the switching element for fusing 30. At this moment, the driver IC for the lower arm 72 has the switching element for fusing 30 driven to be on in a non-saturation region. For example, the voltage between the gate and emitter of the switching element for fusing 30 is set to 9 V in the non-saturation region.

Figure 6:
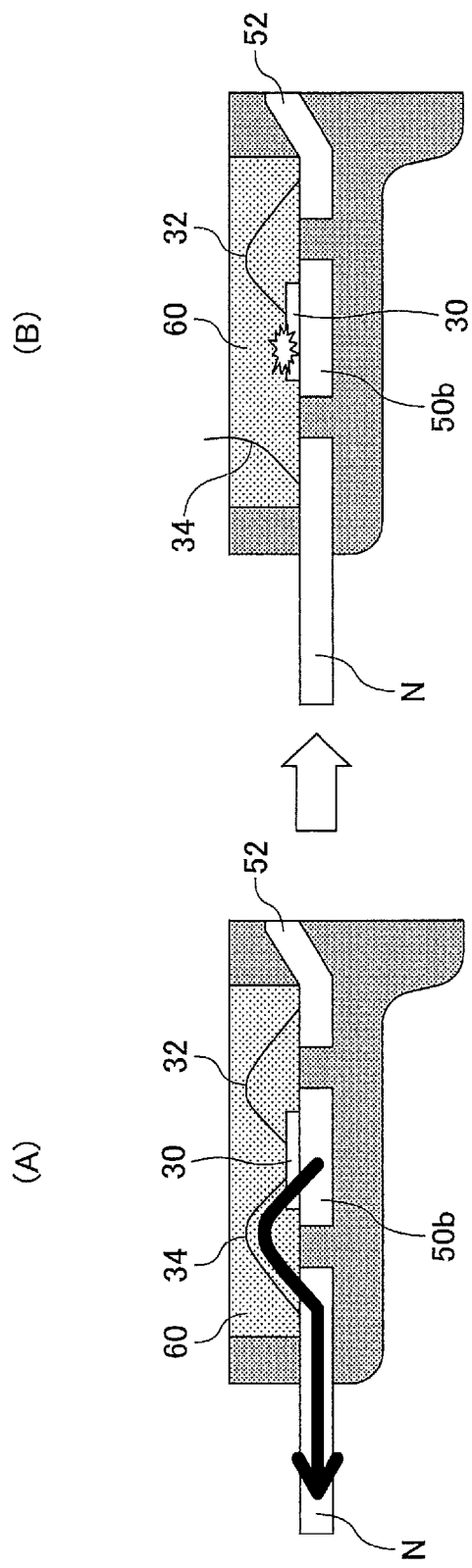
FIG. 6 includes cross-sectional views of a core part of a power conversion device, before and after an electrical path is cut off in the present embodiment.

If the switching element for fusing 30 is driven to be on, as designated by arrows in FIG. 5 and FIG. 6(A), a current flows through the positive-polarity electrode P; the collector of the switching element for fusing 30; the emitter; the bonding wire 34; and the negative-polarity electrode N, in this order. Also, if the switching element for fusing 30 is driven to be on in the non-saturation region, an excessive power loss is generated in the switching element for fusing 30 itself, and the switching element for fusing 30 is thermally destructed.

If the switching element for fusing 30 is thermally destructed, the bonding wire 34, which connects the switching element for fusing 30 with the negative-polarity electrode N, fractures due to a shock generated by the thermal destruction (FIG. 6(B)). If the bonding wire 34 fractures, the electrical path is cut off between the positive-polarity electrode P and the negative-polarity electrode N. Thus, the short circuit between the positive-polarity electrode P and the negative-polarity electrode N is eliminated.

In this configuration for cutting off the electrical path, to implement an electrical-path-cutoff when the IGBT 26a of the lower arm element 26 short-circuits, the bonding wires 32 and 34 between the negative-polarity-side terminal of the negative-polarity electrode N side of the lower arm element (namely, the emitter E of the IGBT 26a) and the negative-polarity electrode N, do not need to be fused by self-heating, and it is sufficient to have the switching element for fusing 30 driven to be on in the non-saturation region.

In this regard, according to the present embodiment, the fusing characteristic of the bonding wires 32 and 34, and the fusing characteristic of the battery fuse 18 as well, can be securely set out of the normal use range. Therefore, if a ripple or transient current is generated in normal use, it is possible to prevent the bonding wires 32 and 34 from erroneously fusing, and it is possible to secure the tolerance of the bonding wires 32 and 34 for a ripple or transient current.

Also, in the above configuration for cutting off the electrical path, to implement the electrical-path-cutoff when the IGBT 26a of the lower arm element 26 short-circuits, it is sufficient to detect a short circuit between the positive-polarity electrode P and the negative-polarity electrode N, to have the switching element for fusing 30 driven to be on in the non-saturation region. If a short circuit is generated in the IGBT 26a of the lower arm element 26 when the IGBT 24a of the upper arm element 24 is driven to be on, the generation of the short circuit is detected by the driver IC for the upper arm 70, transferred to the driver IC for the lower arm 72 via the photocouplers 78 and 82, and then, the driver IC for the lower arm 72 has the switching element for fusing 30 driven to be on.

In this regard, according to the present embodiment, the electrical-path-cutoff due to a short circuit in the IGBT 26a of the lower arm element 26, is not implemented by fusing the bonding wire 34 by self-heating, but implemented by fracturing the bonding wire 34 by a shock of thermal destruction occurring when the switching element for fusing 30 itself is driven to be on in the non-saturation region. Therefore, the electrical-path-cutoff can be executed responsively and promptly.

Therefore, according to the power conversion device 10 in the present embodiment, it is possible to implement the electrical-path-cutoff between the positive-polarity electrode P and the negative-polarity electrode N only if the IGBT 26a of the lower arm element 26 short-circuits, and to implement the cutoff at a timing earlier than when the battery fuse 18 fuses. Therefore, according to the present embodiment, it is possible to avoid the electrical-path-cutoff between the positive-polarity electrode P and the negative-polarity electrode N being executed by a factor other than a short circuit of the IGBT 26a of the lower arm element 26, and to avoid the battery fuse 18 being fused when the IGBT 26a of the lower arm element 26 short-circuits.

Note that, in the present embodiment, in normal use, a current flows through a path of the lower arm element 26; the bonding wire 32; the emitter of the switching element for fusing 30; the bonding wire 34; and the negative-polarity electrode N. Therefore, the inductance of the electrical path is comparatively low, and a loss generated in the electrical path is limited. Therefore, according to the power conversion device 10 in the present embodiment, it possible to lower the loss on the electrical path in normal use.

Also, in the present embodiment, the switching element for fusing 30 is a semiconductor element that is driven to be on in the non-saturation region when the IGBT 26a of the lower arm element 26 short-circuits, and hence, just needs to have a low current capacitance sufficient enough to realize its function. Therefore, according to the power conversion device 10 in the present embodiment, it is possible to avoid the switching element for fusing 30 being larger, and to downsize the apparatus 10 itself.

Also, in the present embodiment, the bonding wire 34 to cut off the electrical path is not a wire that has resin molding applied by using an epoxy resin or the like on the main body side of the power module 40, but a wire that is protected by the gelatinous member 60. Therefore, according to the present embodiment, being different from a configuration in which the bonding wire 34 has resin molding applied resin molding, it is possible to avoid a circumstance where the electrical path is not cut off by the bonding wire 34 due to the resin molding. Also in this regard, it is possible to avoid having the battery fuse 18 fused when the IGBT 26a of the lower arm element 26 short-circuits.

Note that, in the above embodiments, the sense emitter SE of the IGBT 24a of the upper arm element 24, the current sense resistor 74, the comparator 76, and the driver IC for the upper arm 70 correspond to a "short-circuit detection circuit" described in the claims; the bonding wire 34 corresponds to a "cutoff part" described in the claims; and the driver IC for the upper arm 70 and the driver IC for the lower arm 72 correspond to a "fuse driver circuit" described in the claims.

Figure 7:
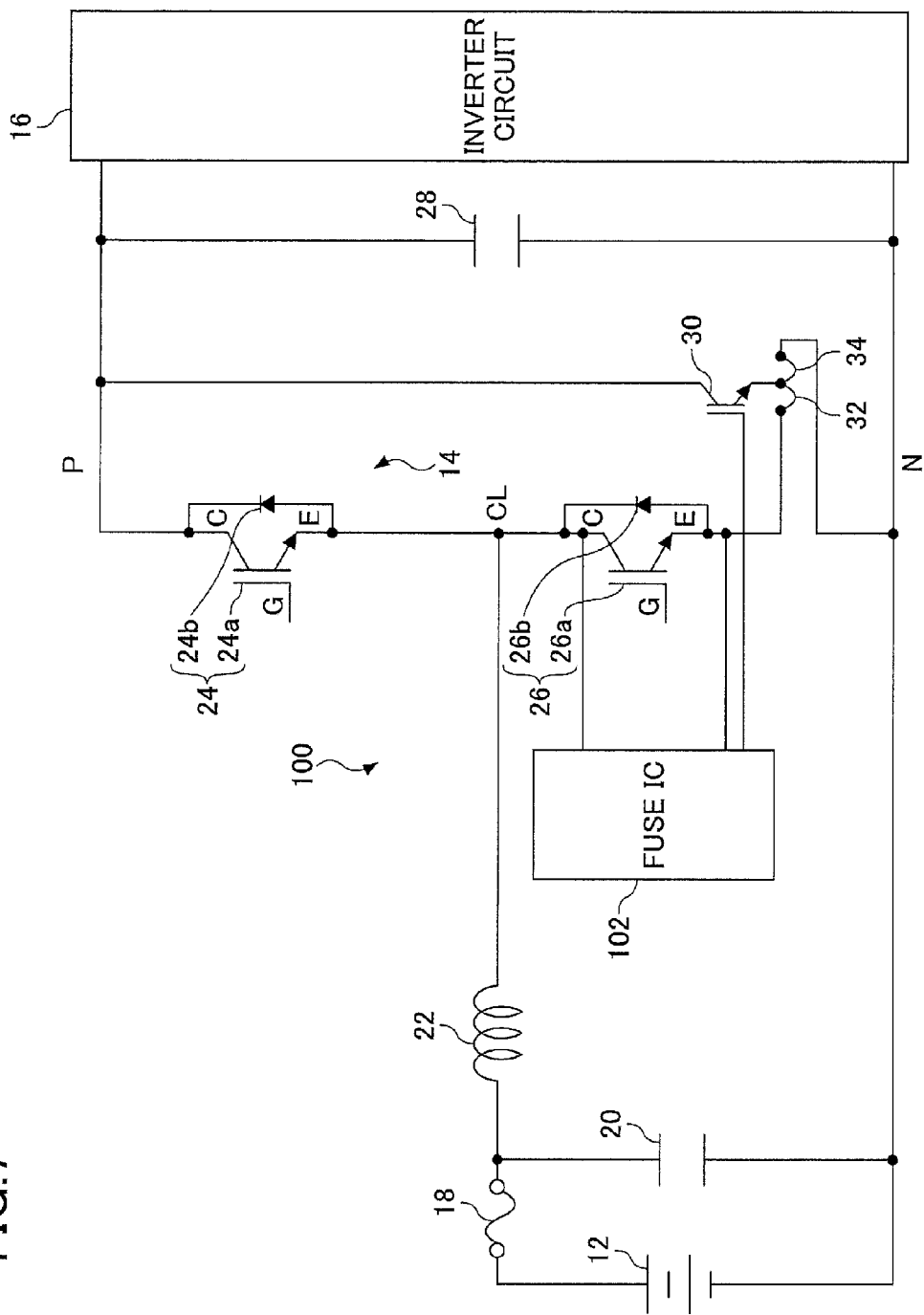
FIG. 7 is a circuit configuration diagram of a power conversion device according to a modified example of the present invention.

Incidentally, in the above embodiments, to detect a short circuit in the lower arm element 26, a current is used that flows in the sense emitter SE of the IGBT 24a of the upper arm element 24. However, the present invention is not limited to that, but as illustrated in FIG. 7, a fuse IC 102 is newly disposed in a power conversion device 100, and the voltage between the collector and emitter of the lower arm element 26 may be used to detect a short circuit in the lower arm element 26.

In this modified example, the fuse IC 102 may monitor the voltage between the collector and emitter of the lower arm element 26, to detect a short circuit in the lower arm element 26 by a method, for example, DESAT. In this case, the fuse IC 102 may have the switching element for fusing 30 driven to be on in the non-saturation region when detecting a short circuit in the lower arm element 26. In this modified example, substantially the same effect can be obtained as in the above embodiments. Note that, in this modified example, the fuse IC 102 corresponds to a "short-circuit detection circuit" described in the claims.

Also, in the above embodiments, a short circuit is detected in the lower arm element 26 that constitutes the booster circuit 14. However, the present invention is not limited to that, but a short circuit may be detected in an arm element that constitutes the inverter circuit 16.

Also, in the above embodiments, as switching elements included in the upper arm element 24 and the lower arm element 26 or the power semiconductors, the IGBTs 24a and 26a are used. However, the present invention is not limited to that, but power MOSFETs may be used.

Also, in the above embodiments, the power conversion device 10 is built in an electric vehicle or a hybrid vehicle. However, the present invention is not limited to that, but it may be built in an apparatus other than a vehicle.

DESCRIPTION OF REFERENCE SYMBOLS 10 power conversion device
12 in-vehicle battery
14 booster circuit
16 inverter circuit
18 battery fuse
24 upper arm element
26 lower arm element
30 switching element for fusing
32, 34 bonding wire
40 power module
70 driver IC for the upper arm
72 driver IC for the lower arm
P positive-polarity electrode
N negative-polarity electrode
CL common connection point

The invention claimed is:

1. A power conversion device, comprising:
a pair of power semiconductor elements configured to be an upper arm element and a lower arm element, being connected in series between a positive-polarity electrode and a negative-polarity electrode;
a short circuit detection circuit configured to detect a short circuit in the lower arm element;
a switching element for fusing, configured to be disposed between a positive-polarity-side terminal of the upper arm element on the positive-polarity electrode side, and a negative-polarity-side terminal of the lower arm element on the negative-polarity electrode side, and to be driven to have the positive-polarity-side terminal connected with the negative-polarity electrode when the short circuit is detected; and
a cutoff part configured to be made of a thin metallic wire for having the negative-polarity-side terminal connected with the negative-polarity electrode.

2. The power conversion device, as claimed in claim 1, further comprising:
a fuse driver circuit configured to drive the switching element for fusing to be on when the short circuit is detected by the short-circuit detection circuit.

3. The power conversion device, as claimed in claim 2, wherein the fuse driver circuit drives the switching element for fusing to be on in a non-saturation region.

4. The power conversion device, as claimed in claim 1, wherein the switching element for fusing is a high-voltage-tolerant, small-capacitance IGBT being tolerant for a voltage between the positive-polarity electrode and the negative-polarity electrode.

5. The power conversion device, as claimed in claim 4, wherein the switching element for fusing is implemented to have a collector connected with the positive-polarity-side terminal, and an emitter connected with the negative-polarity-side terminal, wherein the thin metallic wire of the cutoff part is disposed between the emitter of the switching element for fusing, and the negative-polarity electrode.

6. The power conversion device, as claimed in claim 5, wherein the negative-polarity-side terminal is connected with the emitter of the switching element for fusing via a thin metallic wire.

7. The power conversion device, as claimed in claim 1, wherein the short-circuit detection circuit detects the short-circuit in the lower arm element, based on a current flowing in a sense emitter when the upper arm element is driven to be on.

8. The power conversion device, as claimed in claim 1 wherein the short-circuit detection circuit detects the short-circuit in the lower arm element, based on a voltage between a collector and an emitter of the lower arm element.

9. The power conversion device, as claimed in claim 1, wherein the pair of the power semiconductor elements are elements built in a power module having resin molding applied.

10. The power conversion device, as claimed in claim 1, wherein the pair of the power semiconductor elements are elements constituting a booster or a step-down circuit, or an inverter circuit.

* * * * *